(12) United States Patent
Kwan et al.

(10) Patent No.: US 7,954,689 B2
(45) Date of Patent: Jun. 7, 2011

(54) VACUUM WIRE TENSIONER FOR WIRE BONDER

(75) Inventors: Ka Shing Kenny Kwan, Singapore (SG); Yue Zhang, Singapore (SG); Yam Mo Wong, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 149 days.

(21) Appl. No.: 11/744,492

(22) Filed: May 4, 2007

(65) Prior Publication Data

US 2008/0272178 A1    Nov. 6, 2008

(51) Int. Cl.
*B23K 37/00* (2006.01)
(52) U.S. Cl. .......................... 228/4.5; 228/904
(58) Field of Classification Search .................. 226/97.1, 226/97.4; 228/110.1–111.5, 180.5, 1.1, 904, 228/4.5; 156/64, 73.1, 73.2, 358, 580.1
See application file for complete search history.

(56) References Cited

U.S. PATENT DOCUMENTS

| | | | | |
|---|---|---|---|---|
| 4,069,961 A | * | 1/1978 | Nicklaus et al. | 228/1.1 |
| 4,322,027 A | * | 3/1982 | Reba | 226/97.4 |
| 4,928,871 A | * | 5/1990 | Farassat | 228/180.5 |
| 5,191,680 A | * | 3/1993 | Kaneko et al. | 19/299 |
| 5,402,927 A | * | 4/1995 | Frasch | 228/180.5 |
| 5,685,476 A | * | 11/1997 | Miyoshi | 228/180.5 |
| 6,495,789 B2 | * | 12/2002 | Baiardi et al. | 219/69.12 |
| 6,619,530 B2 | * | 9/2003 | Ushiki et al. | 228/4.5 |
| 2006/0091181 A1 | | 5/2006 | Eder et al. | 228/4.5 |
| 2006/0219754 A1 | * | 10/2006 | Clauberg et al. | 228/4.5 |

* cited by examiner

*Primary Examiner* — Kiley Stoner
*Assistant Examiner* — Carlos Gamino
(74) *Attorney, Agent, or Firm* — Ostrolenk Faber LLP

(57) ABSTRACT

A wire tensioner is provided for a wire bonder, the wire tensioner comprising a tubular body having a bore through which bonding wire is receivable and a bore outlet at an end of the tubular body from which the bonding wire is extendable towards a bonding tool. A chamber is formed next to the bore outlet that substantially encloses the bore outlet, the chamber including an air inlet connected to it that is operative to introduce clean air into the chamber. A vacuum outlet is connected to a side of the tubular body and is in fluid communication with the chamber via the bore, the vacuum outlet being operative to draw air from the bore outlet through the bore whereby to pull the wire.

19 Claims, 2 Drawing Sheets

VACUUM WIRE TENSIONER FOR WIRE BONDER

FIELD OF THE INVENTION

The invention relates to a wire bonding apparatus for making wire connections between electronic devices, and in particular, to a wire tensioner for controlling the feeding of wire in such wire bonding apparatus.

BACKGROUND AND PRIOR ART

In a wire bonding process, electrically conductive wires are bonded between electrical bonding pads found on semiconductor devices, such as between a semiconductor die and a substrate onto which the die is attached. The substrate is usually a semiconductor leadframe. The electrical connection could also be made between bonding pads found on separate semiconductor dice. The bond is formed by a bonding tool which may be in the form of a capillary attached to an ultrasonic transducer for generating ultrasonic energy to the capillary tip.

Wire is continually fed to the capillary in order to make wire connections. The wire feeding system may comprise a clamp that is operative to secure the wire relative to the bonding tool in order to pull and feed a length of wire to the capillary, as well as a wire tensioner to pull the wire in a reverse direction. The need to pull the wire in a reverse direction may occur, for instance, after a molten free-air ball is formed at a tail end of the wire after sparking with an electronic flame-off (EFO) wand, and when forming wire loops thereafter.

The wire bonding apparatus commonly uses a wire tensioner actuated by air to ensure the centering of the bonding wire and the molten ball with respect to the capillary tip before ball bonding is performed. This is to ensure accuracy of placement of the bonded ball at the first bond. After EFO sparking, the formed ball is pulled up by the wire tensioner to sit in a central position under the capillary. The consistency of ball centering relies on the stability of the pulling force exerted by the wire tensioner. Furthermore, consistency of the wire tension force is necessary to promote wire looping consistency, so that the loop heights of multiple wire loops that are formed can be better controlled. Therefore, periodic checking and cleaning of the wire tensioner is required to ensure the consistency of ball centering and of the wire tensioning force.

Conventionally, the wire is led through a bore of the wire tensioner, and the wire may be pulled by a force generated when compressed air is injected at high pressure into the bore to pull the wire. A prior art wire tensioner that utilizes compressed air is described in US Patent Publication No. 2006/0091181A1 entitled "Wire Tensioner for a Wire Bonder". The wire tensioner that is described has a body structure defining a passage for receiving a wire, the passage including an inlet opening and an outlet opening through which the wire is configured to extend. The wire tensioner has an inlet port through which pressurized fluid is received into the wire tensioner and an exhaust port through which pressurized fluid is exhausted from the wire tensioner.

Use of a compressed air to generated the aforesaid pulling force has the disadvantage that, on its own, a high volume of compressed is required to generate a sufficient force to move the wire. As a result, the problem of turbulence created in the air flow as it exits from the tensioner causes undesirable wire vibration and spinning that may impose torque and whipping disturbances to the wire being fed through the wire tensioner. Furthermore, the prior art design generates compressed air directly into the passage where the wire is located, which further aggravates the problems of wire vibration and spinning when compressed air is injected directly onto the wire.

Another approach for generating the necessary wire tensioning force in a wire tensioner is by the use of vacuum suction force. FIG. 1 is a schematic cross-sectional view of a conventional vacuum wire tensioner 100 that is available in the prior art. The wire tensioner 100 comprises a wire inlet 102, inner tube 104 and wire outlet 106 having a central bore 108 extending through the respective wire inlet 102, inner tube 104 and wire outlet 106. A bonding wire 110, such as gold wire, is led through the central bore 108 from the wire inlet 102 to the wire outlet 106 whereat the bonding wire 110 is extended towards a capillary (not shown). The wire inlet 102, inner tube 104 and wire outlet 106 are substantially enclosed by a wire tensioner housing 112, which also serves as a means for securing the wire tensioner 100 to a wire bonding apparatus.

Near a mid-point of the wire tensioner housing 112, a vacuum port 114 is located to generate a vacuum suction force at the base of the inner tube 104. This vacuum suction force is operative to pull the bonding wire 110 located in the wire outlet 106 upwards. In order to supplement the vacuum suction force from the vacuum port 114, a compressed air inlet 116 is located at the top of the inner tube 104 to generate a force to push the bonding wire 110 upwards. To ensure that a minimum of air passes through the inner tube 104 and in order to facilitate the creation of the above air flows through the wire inlet 102 and wire outlet 106, the central bore 108 in the inner tube 104 is formed with a smaller cross-sectional area than the central bores 108 of the wire inlet 102 and the wire outlet 106. The combination of forces from the vacuum port 114 and compressed air inlet 116 generate a sufficient force to reliably pull the wire without causing any significant wire vibration and spinning encountered by using compressed air alone.

However, a problem with the conventional design illustrated in FIG. 1 is that ambient air 118 containing contaminants generated from the surrounding during wire bonding are sucked into the central bore 108 of the wire tensioner 100 through the mouth of the wire outlet 106. After a period of usage, the inner components of the wire tensioner may become clogged with contaminants, and this results in the necessity for frequent cleaning of the wire tensioner 100. Frequent cleaning is inconvenient to the operator and leads to down-time of the wire bonding apparatus.

SUMMARY OF THE INVENTION

It is thus an object of the invention to seek to achieve the benefits of using a vacuum wire tensioner while at the same time reducing the introduction of contaminants into the wire tensioner and avoiding the need for frequent cleaning of the wire tensioner.

According to a first aspect of the invention, there is provided a wire tensioner for a wire bonder, comprising: a tubular body having a bore through which bonding wire is receivable and a bore outlet at an end of the tubular body from which the bonding wire is extendable towards a bonding tool; a chamber formed next to the bore outlet that substantially encloses the bore outlet; an air inlet connected to the chamber that is operative to introduce clean air into the chamber; and a vacuum outlet connected to a side of the tubular body and which is in fluid communication with the chamber via the bore, the vacuum outlet being operative to draw air from the bore outlet through the bore whereby to pull the wire.

According to a second aspect of the invention, there is provided a wire bonding apparatus comprising: a bonding tool configured to receive bonding wire for bonding; and a wire tensioner operative to control the feeding of bonding wire to the bonding tool, the wire tensioner comprising: a tubular body having a bore through which bonding wire is receivable and a bore outlet at an end of the tubular body from which the bonding wire is extendable towards the bonding tool; a chamber formed next to the bore outlet that substantially encloses the bore outlet; an air inlet connected to the chamber that is operative to introduce clean air into the chamber; and a vacuum outlet connected to a side of the tubular body and which is in fluid communication with the chamber via the bore, the vacuum outlet being operative to draw air from the bore outlet through the bore whereby to pull the wire.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

An example of a preferred embodiment of a vacuum wire tensioner in accordance with the invention will now be described with reference to the accompanying drawings, in which.

DETAILED DESCRIPTION OF THE PREFERRED EMBODIMENT OF THE INVENTION

Figure 1:
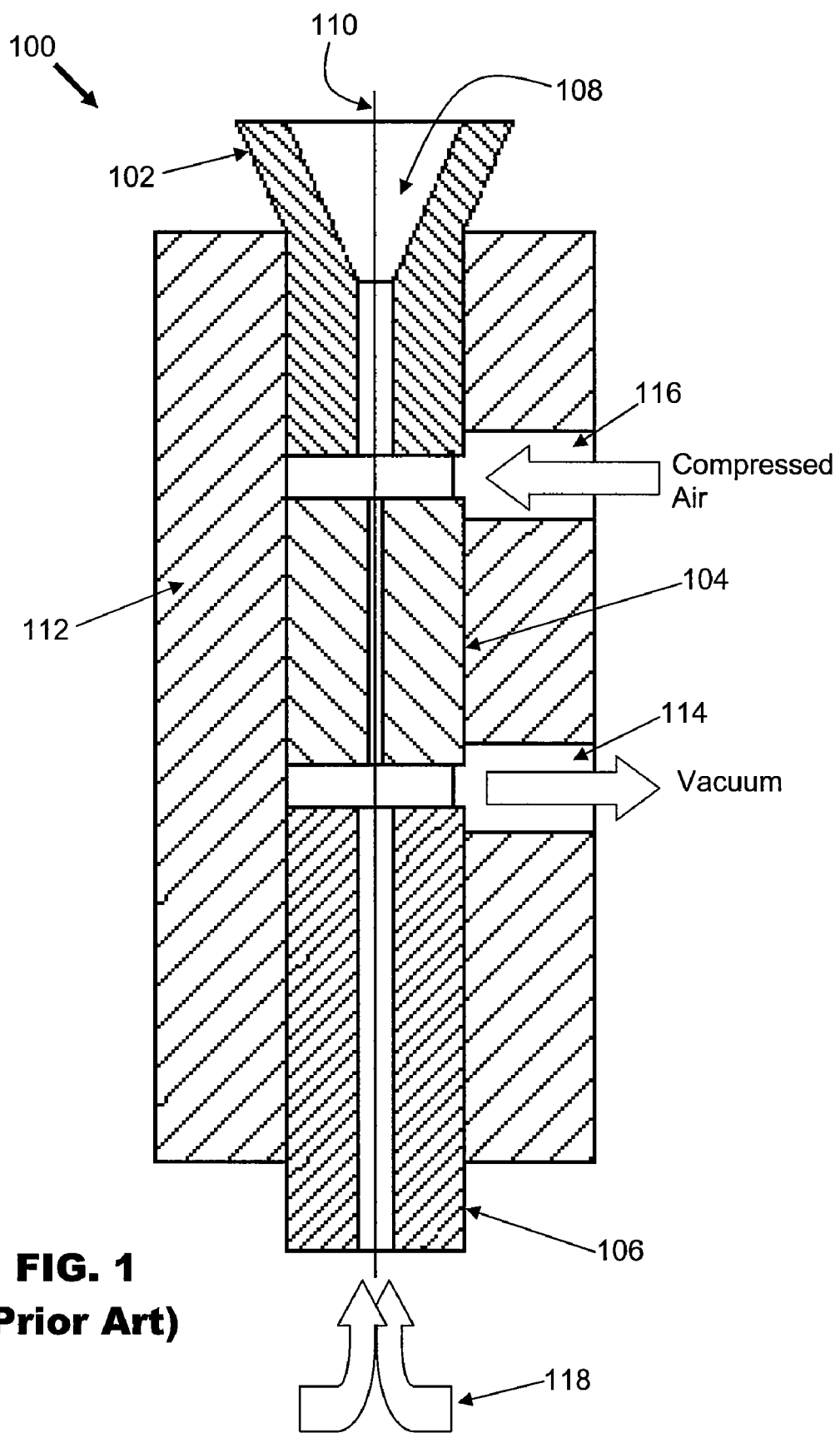
FIG. 1 is a schematic cross-sectional view of a conventional vacuum wire tensioner that is available in the prior art.
Figure 2:
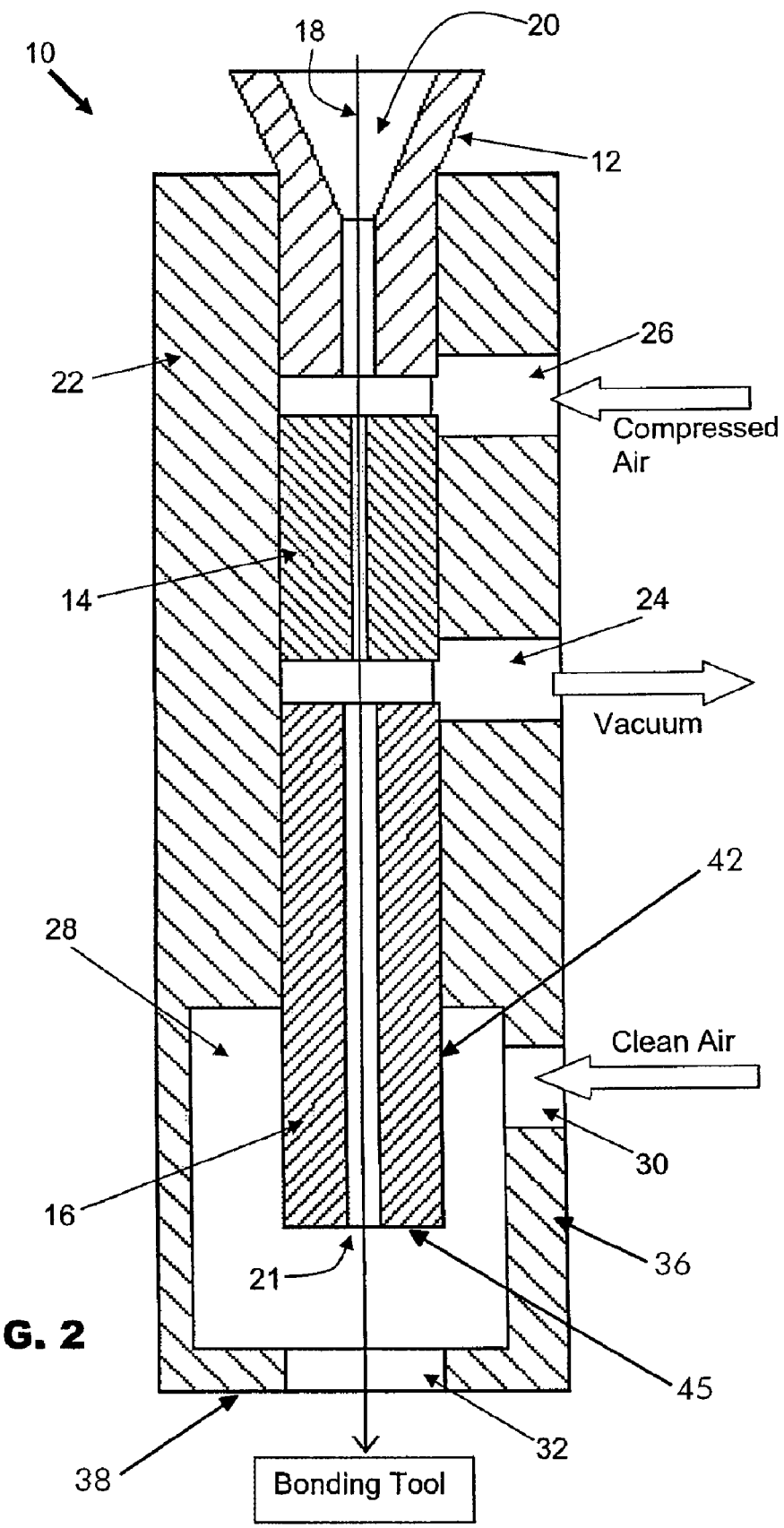
FIG. 2 is a schematic cross-sectional view of a vacuum wire tensioner according to the preferred embodiment of the invention.

FIG. 2 is a schematic cross-sectional view of a vacuum wire tensioner according to the preferred embodiment of the invention. The wire tensioner 10 comprises a tubular body through which bonding wire is receivable, the tubular body including a wire inlet 12, inner tube 14 and wire outlet 16. The tubular body has a central bore 18 extending through the respective wire inlet 12, inner tube 14 and wire outlet 16. Bonding wire 20, such as gold wire, is led through the central bore 18 from the wire inlet 12 to the wire outlet 16. The bonding wire 20 is extended from a bore outlet 21 located at an end of the wire outlet 16 portion of the tubular body towards a capillary (not shown) of a bonding tool. The wire inlet 12, inner tube 14 and wire outlet 16 are substantially enclosed by a wire tensioner housing 22, which also serves as a means to secure the wire tensioner 10 to a wire bonding apparatus by securing the housing 22.

Near a mid-point of the wire tensioner housing 22, a vacuum outlet, which may be in the form of a vacuum port 24, is connected to a side of the tubular body and is located at the base of the inner tube 14 to generate a vacuum suction force. As the vacuum port 24 is in fluid communication with the bore outlet 21 through the central bore 18, this vacuum suction force is operative to pull the bonding wire 20 located in the wire outlet 16 by generating a vacuum air-flow in the wire outlet 16. In order to supplement the vacuum suction force from the vacuum port 24, a compressed air inlet 26 is located at the top of the inner tube 14 to generate a force in the wire inlet 12 to push the bonding wire 20 upwards. However, the pulling force is generated primarily by the vacuum port 24, so the force required at the compressed air inlet 26 need not be as great as in conventional compressed air wire tensioners. To ensure that a minimum of air passes through the inner tube 14 in order to facilitate the creation of the above force-generating air flows, the central bore 18 in the inner tube 14 is formed with a smaller cross-sectional area than the central bores 18 of the wire inlet 12 and the wire outlet 16.

In order to reduce the introduction of contaminated ambient air into the central bore 18 through the mouth of the wire outlet 16, a chamber 28 is formed next to the bore outlet 21 of the wire outlet 16 and substantially encloses the bore outlet 21. Preferably, the chamber 28 is formed by modifying the wire tensioner housing 22 to include a void, i.e. an empty space filled solely by air, that surrounds the base of the wire outlet 16 and extends alongside the walls of the housing, between these walls and throughout a height of the chamber 28.

Furthermore, an air inlet port 30 is preferably connected to a side of the chamber 28 in order to introduce a supply of clean air into the chamber 28 to envelope the wire outlet 16 with clean air. Such clean air may be in the form of compressed air. The rate of clean air introduced into the chamber 28 should preferably be at least the same as or greater than the rate of evacuation of air at the vacuum port 24. Since the vacuum port 24 is in fluid communication with the chamber 28, this helps to ensure that a supply of clean air enveloping the wire outlet 16 can be maintained to impede the flow of contaminated air from the ambient atmosphere into the chamber 28 and the central bore 18. The chamber 28 further comprises a chamber opening 32 through which the bonding wire 20 is extendable from the wire outlet 16 to the bonding tool.

FIG. 2 also shows a terminal bottom face 45 of tubular body at bore outlet 21, and side surfaces 42 of the tubular body transverse to the terminal bottom face 45. FIG. 2 further illustrates sidewalls 36 of a wire tensioner housing 22 and a bottom wall 38 of housing 22.

Moreover, it should be noted that the air inlet port 30 is located at a higher position than the bore outlet 21 of the wire outlet 16. Hence, the air inlet port 30 is directed at an external surface at a side of the wire outlet 16 which is spaced from the bore outlet 21 when injecting clean air into the chamber 28, instead of directly into the central bore 18 of the wire outlet and/or directly onto the bonding wire 20. This prevents the clean air from swaying the bonding wire 20 in the central bore 18 through the force of the clean air flow, which may lead to vibration of the wire 20 when the air flow rate is high. This further avoids the problem of vibration of the bonding wire 20 that is experienced in the prior art as mentioned above, especially for compressed air wire tensioners.

Preferably, the size of the chamber 28 should not be less than 0.6 cm$^3$, to avoid excessive air flow pressure being introduced in the chamber 28 by the injection of clean air. Also, the chamber opening 32 preferably has a width of 2 mm to 5 mm.

It should be appreciated that the vacuum wire tensioner according to the preferred embodiment of the invention helps to avoid the problem of contaminated ambient air being sucked into the central bore of the wire tensioner during operation. Furthermore, since the clean air introduced into the wire tensioner is not generated directly onto the bonding wire, the bonding wire is not swayed by the injected air. The problem of wire vibration can also be avoided as no turbulence is created.

The invention described herein is susceptible to variations, modifications and/or additions other than those specifically described and it is to be understood that the invention includes all such variations, modifications and/or additions which fall within the spirit and scope of the above description.

The invention claimed is:

1. A wire tensioner for a wire bonder, the wire tensioner comprising:
   a tubular body having a bore configured so that a bonding wire is received through the bore, the tubular body further comprising a terminal bottom face and side surfaces, and having a bore outlet located in the terminal bottom face at a lowermost end of the tubular body, the bore outlet configured so that the bonding wire extends from the bore outlet towards a bonding tool;
   a housing enclosing the tubular body and including a plurality of walls including side walls and a bottom wall transverse to the side walls, the walls of the housing and the tubular body defining a hollow chamber comprising a void filled solely by air, the void surrounding and enclosing the terminal bottom face and side surfaces of the lowermost end of the tubular body and the bore outlet, the hollow chamber having a lateral diameter measured between the side walls;
   the chamber having a chamber opening formed below the bore outlet on a lowermost surface of the housing, the chamber opening defined by the bottom wall of the housing such that a diameter of the chamber opening is smaller than the lateral diameter of the hollow chamber;
   an air inlet connected to the chamber, the air inlet being configured to direct clean air into the chamber towards the lowermost end of the tubular body where the bore outlet is located; and
   a vacuum outlet connected to a side of the tubular body, the vacuum outlet being in fluid communication with the chamber via the bore, the vacuum outlet being operative to draw air from the bore outlet through the bore to pull the wire,
   wherein the terminal bottom face of the tubular body contacts solely air of the hollow chamber.

2. The wire tensioner as claimed in claim 1, wherein the housing is configured to be secured to a wire bonding apparatus.

3. The wire tensioner as claimed in claim 1, wherein the clean air comprises compressed air.

4. The wire tensioner as claimed in claim 1, wherein the air inlet and the vacuum outlet are configured such that a rate of introduction of clean air into the chamber through the air inlet is at least the same as or greater than a rate of evacuation of air at the vacuum outlet.

5. The wire tensioner as claimed in claim 1, wherein the air inlet is configured and operative to direct the clean air at a side of the tubular body that is spaced from the bore outlet.

6. The wire tensioner as claimed in claim 1, wherein the size of the hollow chamber is at least 0.6 cm$^3$.

7. The wire tensioner as claimed in claim 1, wherein the chamber opening is positioned and configured so that the bonding wire extends from the bore outlet towards the bonding tool through the chamber opening.

8. The wire tensioner as claimed in claim 7, wherein the chamber opening has a width of between 2 mm and 5 mm.

9. The wire tensioner as claimed in claim 1, wherein the air inlet is positioned to terminate in the side walls of the housing at a position opposite to the side surfaces of the tubular body.

10. The wire tensioner as claimed in claim 1, wherein the hollow chamber consists of the void filled solely by air.

11. A wire bonding apparatus comprising:
    a bonding tool configured to receive bonding wire for bonding; and
    a wire tensioner operative to control the feeding of bonding wire to the bonding tool, the wire tensioner comprising:
       a tubular body having a bore configured so that a bonding wire is received through the bore, the tubular body further comprising a terminal bottom face and side surfaces, and having a bore outlet located in the terminal bottom face at a lowermost end of the tubular body, the bore outlet configured so that the bonding wire extends from the bore outlet towards a bonding tool;
       a housing enclosing the tubular body and including a plurality of walls including side walls and a bottom wall transverse to the side walls, the walls of the housing and the tubular body defining a hollow chamber comprising a void filled solely by air, the void surrounding and enclosing the terminal bottom face and side surfaces of the lowermost end of the tubular body and the bore outlet, the hollow chamber having a lateral diameter measured between the side walls;
       the chamber having a chamber opening formed below the bore outlet on a lowermost surface of the housing, the chamber opening defined by the botto wall of the a housing such that a diameter of the chamber opening is smaller than the lateral diameter of the hollow chamber;
       an air inlet connected to the chamber, the air inlet being configured to direct clean air into the chamber towards the lowermost end of the tubular body where the bore outlet is located; and
       a vacuum outlet connected to a side of the tubular body, the vacuum outlet being in fluid communication with the chamber via the bore, the vacuum outlet being operative to draw air from the bore outlet through the bore to pull the wire,
       wherein the terminal bottom face of the tubular body contacts solely air of the hollow chamber.

12. The wire bonding apparatus as claimed in claim 11, wherein the clean air comprises compressed air.

13. The wire bonding apparatus as claimed in claim 11, wherein the air inlet and the vacuum outlet are configured such that a rate of introduction of clean air into the chamber through the air inlet is at least the same as or greater than a rate of evacuation of air at the vacuum outlet.

14. The wire bonding apparatus as claimed in claim 11, wherein the air inlet is configured and operative to direct the clean air at a side of the tubular body that is spaced from the bore outlet.

15. The wire bonding apparatus as claimed in claim 11, wherein the size of the hollow chamber is at least 0.6 cm$^3$.

16. The wire bonding apparatus as claimed in claim 11, wherein the chamber opening is positioned and configured so that the bonding wire extends from the bore outlet towards the bonding tool through the chamber opening.

17. The wire bonding apparatus as claimed in claim 16, wherein the chamber opening has a width of between 2 mm and 5 mm.

18. The wire bonding apparatus as claimed in claim 11, wherein the air inlet is positioned to terminate in the side walls of the housing at a position opposite to the side surfaces of the tubular body.

19. The wire tensioner as claimed in claim 11, wherein the hollow chamber consists of the void filled solely by air.

* * * * *